United States Patent
Lin et al.

(10) Patent No.: US 11,848,222 B2
(45) Date of Patent: Dec. 19, 2023

(54) SYSTEM FOR A SEMICONDUCTOR FABRICATION FACILITY AND METHOD FOR OPERATING THE SAME

(71) Applicant: TAIWAN SEMICONDUCTOR MANUFACTURING COMPANY LTD., Hsinchu (TW)

(72) Inventors: Chuan Wei Lin, Hsinchu (TW); Fu-Hsien Li, Taichung (TW); Yong-Jyu Lin, Hsinchu (TW); Rong-Shen Chen, Hsinchu (TW); Chi-Feng Tung, Miaoli County (TW); Hsiang Yin Shen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 322 days.

(21) Appl. No.: 16/925,285

(22) Filed: Jul. 9, 2020

(65) Prior Publication Data

US 2022/0013395 A1 Jan. 13, 2022

(51) Int. Cl.
*H01L 21/677* (2006.01)
*H01L 21/68* (2006.01)

(52) U.S. Cl.
CPC ........ *H01L 21/68* (2013.01); *H01L 21/67724* (2013.01); *H01L 21/67733* (2013.01)

(58) Field of Classification Search
CPC .. H01L 21/67733; H01L 21/68; H01L 21/681
See application file for complete search history.

(56) References Cited

U.S. PATENT DOCUMENTS

| | | | | |
|---|---|---|---|---|
| 6,151,533 | A | * | 11/2000 | Iwasaki ............. H01L 21/67276 700/214 |
| 9,543,180 | B2 | * | 1/2017 | Kamiya ............ H01L 21/67201 |
| 11,139,191 | B2 | * | 10/2021 | Garssen ............ H01L 21/67769 |
| 2007/0002316 | A1 | * | 1/2007 | Choi .................. G01N 21/9501 356/237.2 |
| 2008/0107507 | A1 | * | 5/2008 | Bufano ............. H01L 21/67196 414/217.1 |
| 2009/0222135 | A1 | * | 9/2009 | Asakawa .............. H01L 21/681 901/14 |
| 2013/0333174 | A1 | | 12/2013 | Babbs |
| 2022/0081207 | A1 | * | 3/2022 | Wada ................ H01L 21/67727 |

OTHER PUBLICATIONS

Office Action, Cited References and Search Report dated Sep. 10, 2021 issued by the Taiwan Intellectual Property Office for the Taiwanese Patent Application No. 110106775.

* cited by examiner

*Primary Examiner* — Gerald McClain
(74) *Attorney, Agent, or Firm* — WPAT LAW; Anthony King

(57) ABSTRACT

A system for a semiconductor fabrication facility (FAB) includes an orientation tool and a transporting tool configured to transport at least one customized part. The orientation tool includes a port configured to receive the workpiece, a sensor configured to detect an orientation of the workpiece received in the port and a rotation mechanism configured to turn the workpiece received in the port.

20 Claims, 6 Drawing Sheets

SYSTEM FOR A SEMICONDUCTOR FABRICATION FACILITY AND METHOD FOR OPERATING THE SAME

BACKGROUND

Integrated circuits are typically manufactured in automated or semi-automated facilities, by passing substrates/wafers in and on which the devices are fabricated through a large number of manufacturing operations to complete the devices. The number and the type of manufacturing operations a semiconductor device has to go through may depend on the specifications of the semiconductor device to be fabricated. For instance, a sophisticated chip may require several hundred manufacturing operations.

Furthermore, modern semiconductor fabrication facilities ("FABS") employ systems to transport workpieces such as substrates/wafers and reticles to the tools required in the operation flow. Therefore reticle transporting devices and wafer transporting devices have been adopted in semiconductor manufacturing tools/apparatuses used in manufacturing operations, such as the semiconductor exposure apparatuses used in a photolithography operation. A system that is able to safely and efficiently transfer the workpieces in order to improve the throughput and output rate is thus necessary.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
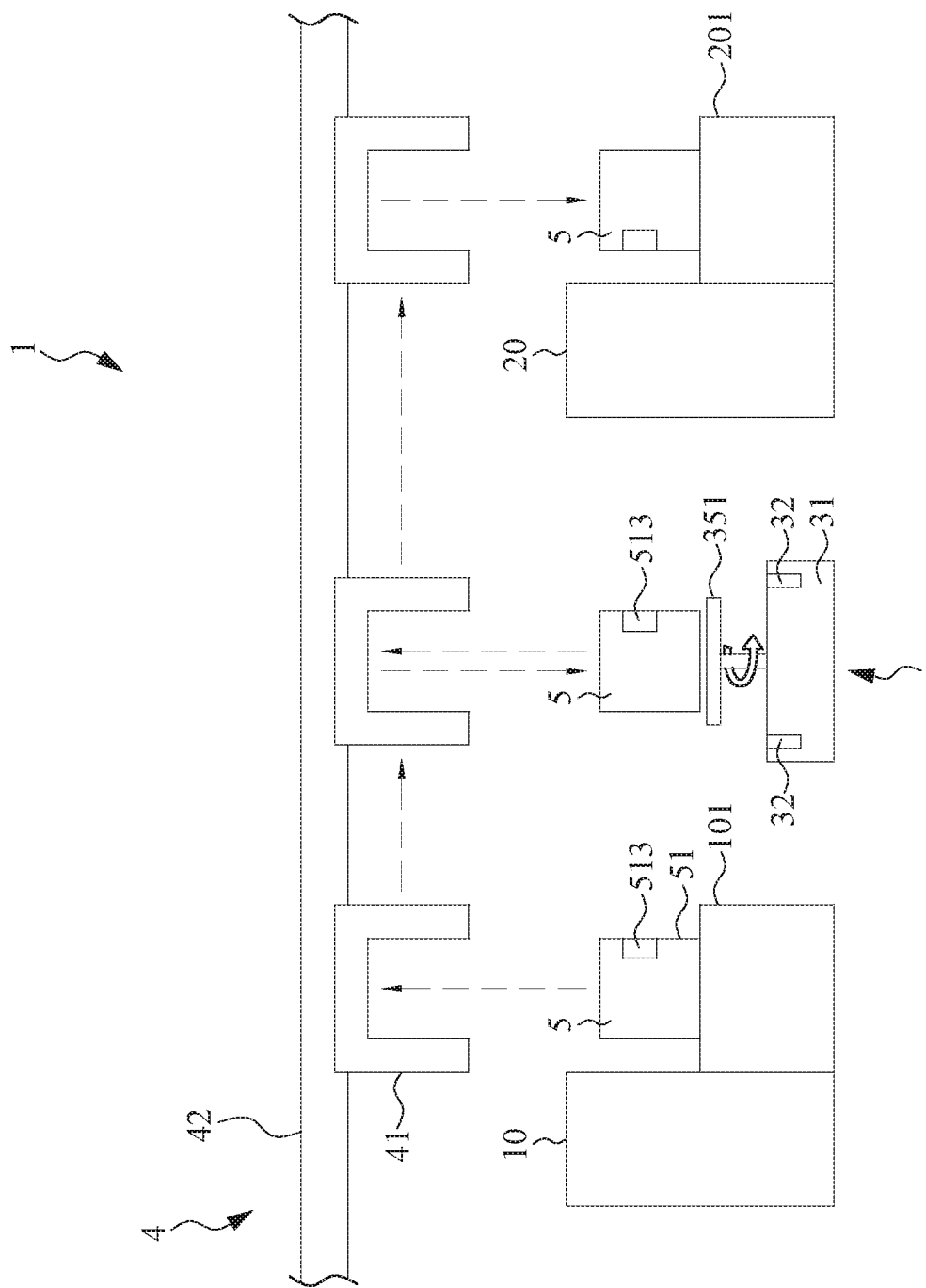
FIG. 1A is a side view of the system for the semiconductor fabrication facility, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features the scope of the disclosure being defined by the claims appended hereto.

During production, customized parts such as reticles or wafers usually are transported from their storage place to manufacturing apparatus/tools and back again by a transporting device in a specific, standardized carrier. When the transporting device is located on and aligned to the manufacturing tool, the carrier is lowered to a load port of the manufacturing tool to load or unload the customized parts.

Present disclosure provides an apparatus and a system for a semiconductor fabrication facility that automatically change and correct the orientation of the workpiece which is moved by the transporting device. The system includes an orientation tool configured to automatically adjust an orientation of the workpiece such that the orientation of the workpiece can meet different specification of different manufacturing tools.

FIG. 1A is a side view of the system 1 for the semiconductor fabrication facility, in accordance with some embodiments of the present disclosure. In some embodiments, the system 1 can be an automated material handling system (AMHS) automatically handling and transporting customized part such as wafer(s) or reticle(s) to manufacturing tools. The AMHS in a semiconductor FAB includes numerous types of automated and manual vehicles for moving and transporting the reticle carriers and/or wafer carriers throughout the FAB during the manufacturing operation. This can include for example, without limitation, automatic guided vehicles (AGVs), personal guided vehicles (PGVs), rail guided vehicles (RGVs), overhead shuttles (OHSs), and overhead hoist transports (OHTs).

As shown in FIG. 1A, the system 1 includes at least two manufacturing tools 10 and 20. The manufacturing tools 10, 20 can be any type of wafer handling, fabrication, testing, metrology, or other equipment commonly used in a semiconductor FAB. In some embodiments of the present disclosure, the manufacturing tool 10 can be, for example but not limited to, a photolithography tool such as an extreme ultraviolet (EUV) lithography tool. The manufacturing tool 10 includes at least a load port 101 for inserting or removing a customized part into or from the first manufacturing tool 10. In some embodiments of the present disclosure, the load port 101 may include separate loading unit and unloading unit. In some embodiments of the present disclosure, the customized part should face in a specific direction when the customized part is inserted into the first manufacturing tool 10. Thus, the customized part received on the load port 101 of the first manufacturing tool 10 should face in the specific direction as well. As shown in FIG. 1A, the carrier 5 received on the load port 101 of the first manufacturing tool 10 has a front side 51 facing away from the first manufacturing tool 10. Further, the manufacturing tool 20 includes at least a load port 201 for inserting or removing a customized part into or from the manufacturing tool 20. In some embodiments of the present disclosure, the load port 201 may include separate loading unit and unloading unit. In some embodiments of the present disclosure, the customized part should face in another specific direction when the customized part is inserted into the second manufacturing tool 20. Thus, the customized part received on the load port 201 of the second manufacturing tool 20 should face in said another specific direction as well. As shown in FIG. 1A, the carrier 5 received in the load port 201 of the first manufacturing tool 20 has the front side 51 facing the first manufacturing tool 10.

The transporting tool 4 integrated in the system 1 is configured to transport at least one customized part such as a wafer or a reticle. For example, the transporting tool 4 transports as at least a reticle when the manufacturing tool 10 is a photolithography tool. In some embodiments of the present disclosure, the transporting tool 4 can be, for example but not limited to, an overhead hoist transports (OHTs). The transporting tool 4 includes the track 42 (including rails) and the OHT vehicle 41. The track 42 is affixed and suspended from the ceiling. The OHT vehicle 41 is movably mounted on the track 42, and operable to transport the customized part such as the reticle in a carrier through the FAB. As shown in FIG. 1A, the OHT vehicle 41 is configured to complement and cooperate with the track 42 for rolling along the track 42 and transporting a carrier 5 from one location to another. Furthermore, the OHT vehicle 41 is configured and operable to vertically pickup, raise/lower, articulate, and release the carrier 5 to and from the manufacturing tool 10, 20.

Referring to FIG. 1A, the system 1 includes an apparatus 3 substantially located between two the manufacturing tools 10 and 20. The apparatus 3 includes a port 31 for receiving the carrier 5 transported by the transporting tool 4. That is, the OHT vehicle 41 can release the carrier 5 in the port 31 of the apparatus 3 or pick up the carrier 5 from the port. The apparatus 3 includes a sensor 32. The sensor 32 is configured to detect and identify the orientation of the carrier 5. That is, the sensor 32 can detect and identify what direction the carrier 5 is facing. In some embodiments of the present disclosure, the sensor 32 may include at least two tag readers, RFID readers or CCD cameras, etc. Further, the apparatus 3 includes a rotation mechanism 31 which is configured to turn the carrier 5 received in the port 31. In some embodiments of the present disclosure, e, the rotation mechanism 35 includes a turntable 351 integrated in the port 31. As shown in FIG. 1A, as the port 31 of the apparatus 3 receives the carrier 5, the carrier 5 is arranged on the turntable 351. Thus, the turntable 351 will cause the carrier 5 to be rotated.

As shown in FIG. 1A, the transporting tool 4 is configured to move the carrier 5 from the first manufacturing tool 10 to the second first manufacturing tool 20. However, the carrier 5 should face to the right when the carrier 5 is inserted into the first manufacturing tool 10, and the carrier 5 should face to the left when the carrier 5 is inserted into the second manufacturing tool 20. Thus, as shown in FIG. 5A, the carrier 5 received in the load port 101 of the first manufacturing tool 10 faces away from the first manufacturing tool 10, and the carrier received in the load port 201 of the second manufacturing 20 faces to the second manufacturing tool 20. Thus, if the carrier 5 is moved from the first manufacturing tool 10 to the second manufacturing 20, the carrier 5 should be turned 180 degrees before the carrier 5 is loaded into the second manufacturing 20.

Referring to FIG. 1A, the carrier 5 has a tag 513 at its front side 51. When the carrier 5 is received in the load port 101 of the first manufacturing tool 10, the carrier 5 faces to the right and thus the tag 513 faces away from the first manufacturing tool 10. The OHT vehicle 41 picks up the carrier 5 from the load port 101 of the first manufacturing tool 10 and moves the carrier 5 to be right above the apparatus 3 along the rack 42. Then, the OHT vehicle 41 lowers the carrier 5 and releases the carrier 5 on the port 31 of the apparatus 3. The sensor 32 detects the tag 513 of the carrier 5 and thus identifies the orientation of the carrier 5. Further, the turntable 351 rotates the carrier 5 to be turned 180 degrees such that the carrier 5 faces to the left. After the carrier 5 is turned 180 degrees, the OHT vehicle 41 picks up the carrier 5 from the port 31 of the apparatus 3 and moves the carrier 5 to be right above the load port 201 of the second manufacturing tool 20 along the rack 42. Then, the OHT vehicle 41 lowers the carrier 5 and releases the carrier 5 on the load port 201 of the second manufacturing tool 20. As shown in FIG. 1A, the carrier 5 faces to the left and the tag 513 faces the second manufacturing tool 20 when the carrier 5 is released on the load port 201 of the second manufacturing tool 20 by the OHT vehicle 41.

Figure 1B:
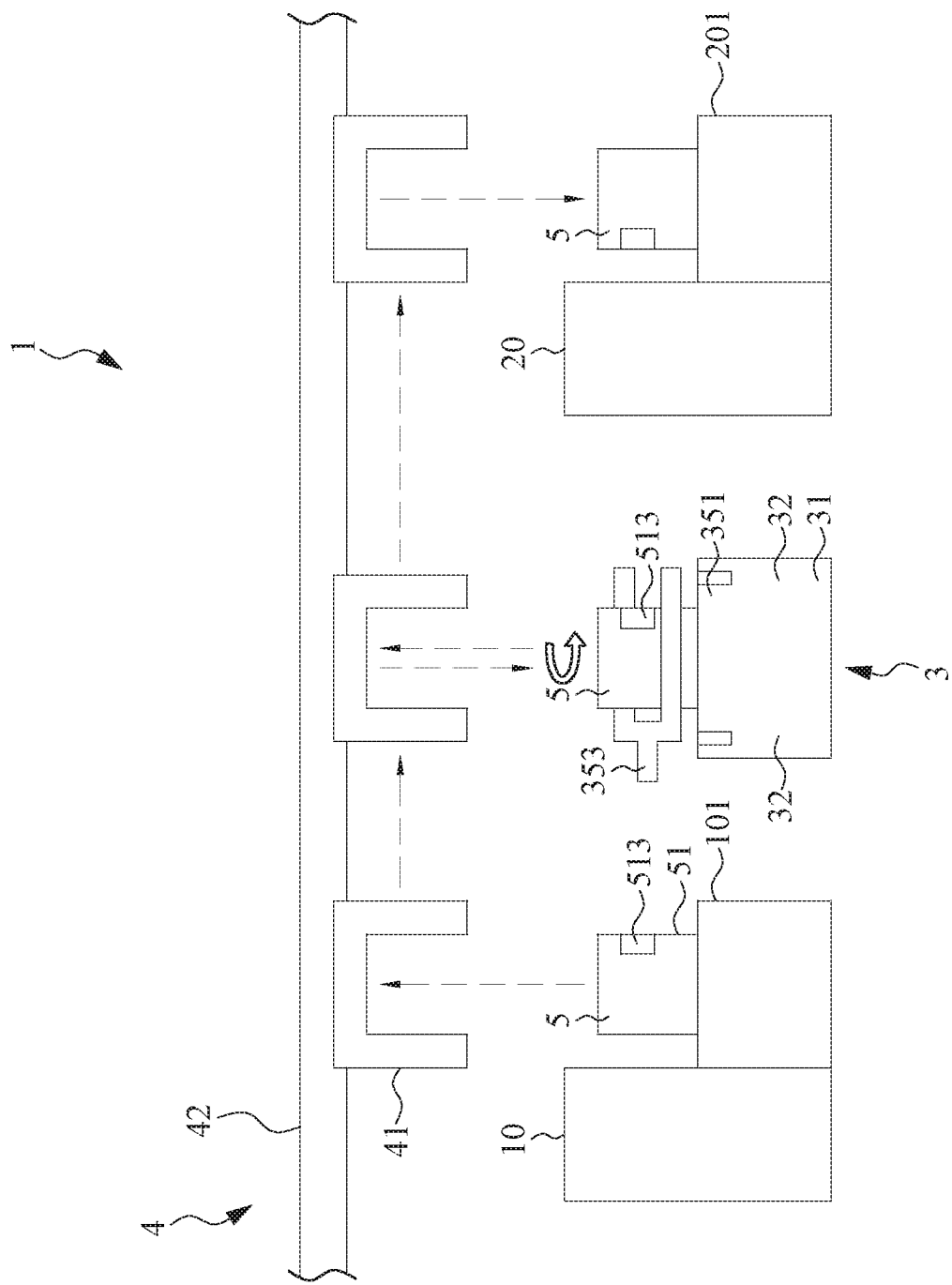
FIG. 1B is a side view of the system for the semiconductor fabrication facility, in accordance with some embodiments of the present disclosure.

FIG. 1B is a side view of the system 1' for the semiconductor fabrication facility, in accordance with some embodiments of the present disclosure. As shown in FIG. 1B, the rotation mechanism 35 includes a robotic arm 353. Referring to FIG. 1B, the robotic arm 353 is configured to grasp the carrier 5 and turn the carrier 5.

Figure 2:
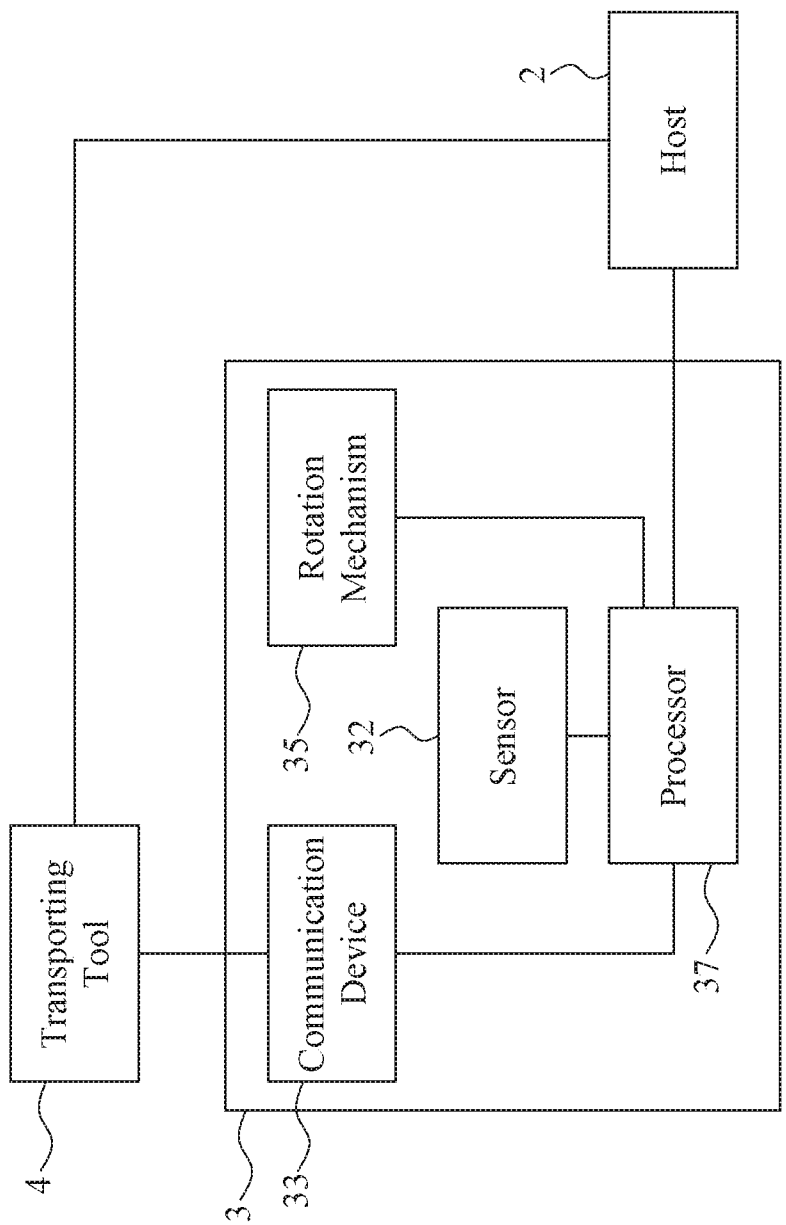
FIG. 2 is a block diagram of the apparatus for transporting the workpiece, in accordance with some embodiments of the present disclosure.

FIG. 2 is a block diagram of the apparatus 3 for transporting the workpiece, in accordance with some embodiments of the present disclosure. Referring to FIG. 2, the apparatus 3 includes a processor 37 connecting to the sensor 32 and rotation mechanism 35. The processor 37 is configured to receive information from the sensor 32 and to drive the rotation mechanism 35. After the sensor 32 detects and identifies the orientation of the carrier 5 received in the port 31, the sensor 32 sends such information to the processor 37. Further, the processor 37 drives the rotation mechanism 35 to rotate the carrier automatically or by demand. The apparatus 3 further includes a communication device 33 connecting to the processor 37. In some embodiments of the present disclosure, the communication device 33 can be, for example but not limited to, an E84 communication. Further, the communication device 33 connects to the transporting tool 4 and is configured to communicate with the transporting tool 4. While the transporting tool 4 moves the carrier 5 to the apparatus 3 or takes away the carrier 5 from the apparatus 3, the communication device 33 can send information to and communicate with the transporting tool 4. In addition, a host 2 connects the transporting tool 4 and the processor 37 of the apparatus 3. The host 2 is configured to monitor and control the transporting tool 4 and the apparatus 3. Further, the host 2 is also configured to send a command to the processor 37 of the apparatus 3. In other words, the host 2 is configured to manage the operation of the system 1.

Figure 3:
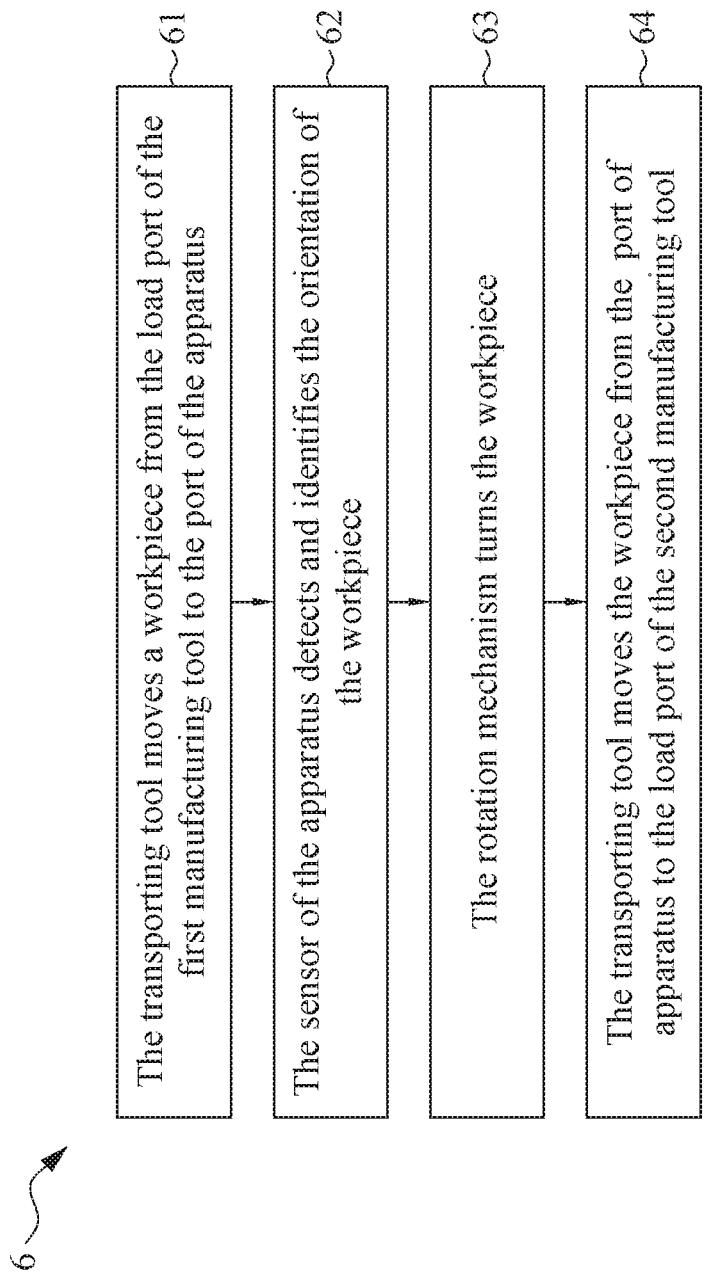
FIG. 3 is a flow chart representing a method for operating the system for the semiconductor fabrication facility, in accordance with some embodiments of the present disclosure.

Referring to FIG. 3 and with additional reference to FIG. 1A and FIG. 1B, an exemplary method 6 illustrates one possible flow through the system 1 of FIG. 1A and/or the system 1 of FIG. 1B.

In Operation 61, the transporting tool 4 moves the carrier 5 from the load port 101 of the first manufacturing tool 10 to the port 31 of the apparatus 3. Referring to FIG. 1, the front side 51 of the carrier 5 faces away from the first manufacturing tool 10 when the carrier 5 is received in the load port 101 of the first manufacturing tool 10. The OHT vehicle 41 picks up the carrier 5 from the load port 101 of the first manufacturing tool 10 and moves the carrier 5 along the rail 42. After the carrier 5 is moved to be right above the port 31 of the apparatus 3 by the OHT vehicle 41, the OHT vehicle 41 lowers the carrier 5 and releases the carrier 5 in the port 31 of the apparatus 3.

In Operation 62, the sensor 32, such as tag readers, RFID readers or CCD cameras, etc., detects the tag 513 of the carrier 5 and thus identifies the orientation of the carrier 5 after the carrier 5 is released in the port 31 of the apparatus 3. That is, the apparatus 3 can identify where the front side 51 of the carrier 5 is by detecting the tag 513 of the carrier 5 and determine whether the carrier 5 should be turned.

In Operation 63, the rotation mechanism 35 is driven to rotate the carrier 5 so as to change the direction of the front side 51 of the carrier 5. In some embodiments of the present disclosure, the rotation mechanism 35 includes a robotic arm 353. The robotic aria can grasp the carrier 5 and rotate the carrier 5. Moreover, in some embodiments of the present disclosure, the rotation mechanism 35 includes a turntable 351 integrated in the port 31. Thus, when the turntable is rotated, the carrier 5 received in the port 31 is rotated accordingly. Referring to FIG. 1A, the front side 51 of the carrier faces to the right when the OHT vehicle 41 releases the carrier 5 in the port 3 of the apparatus 3, and then the turntable 351 rotates the carrier 5 to be turned 180 degrees such that the front side 51 of the carrier 5 faces to the left. Moreover, referring to FIG. 1B, the front side 51 of the carrier faces to the right when the OHT vehicle 41 releases the carrier 5 in the port 3 of the apparatus 3, and then the robotic arm 353 rotates the carrier 5 to be turned 180 degrees such that the front side 51 of the carrier 5 faces to the left.

In Operation 64, the OHT vehicle 41 picks up the carrier 5 from the port 31 of the apparatus 3 and moves the carrier 5 to the second manufacturing tool 20 after the carrier 5 is turned 180 degrees by the rotation mechanism 35 of the apparatus 3. After the carrier 5 is moved to be right above the load port 201 of the second manufacturing tool 20 by the OHT vehicle 41, the OHT vehicle 41 lowers the carrier 5 and releases the carrier 5 in the load port 201 of the second manufacturing tool 20. Referring to FIG. 1A and FIG. 1B, the front side 51 of the carrier 5 faces the second manufacturing tool 20 when the carrier 5 is received in the load port 201 of the second manufacturing tool 20.

Figure 4:
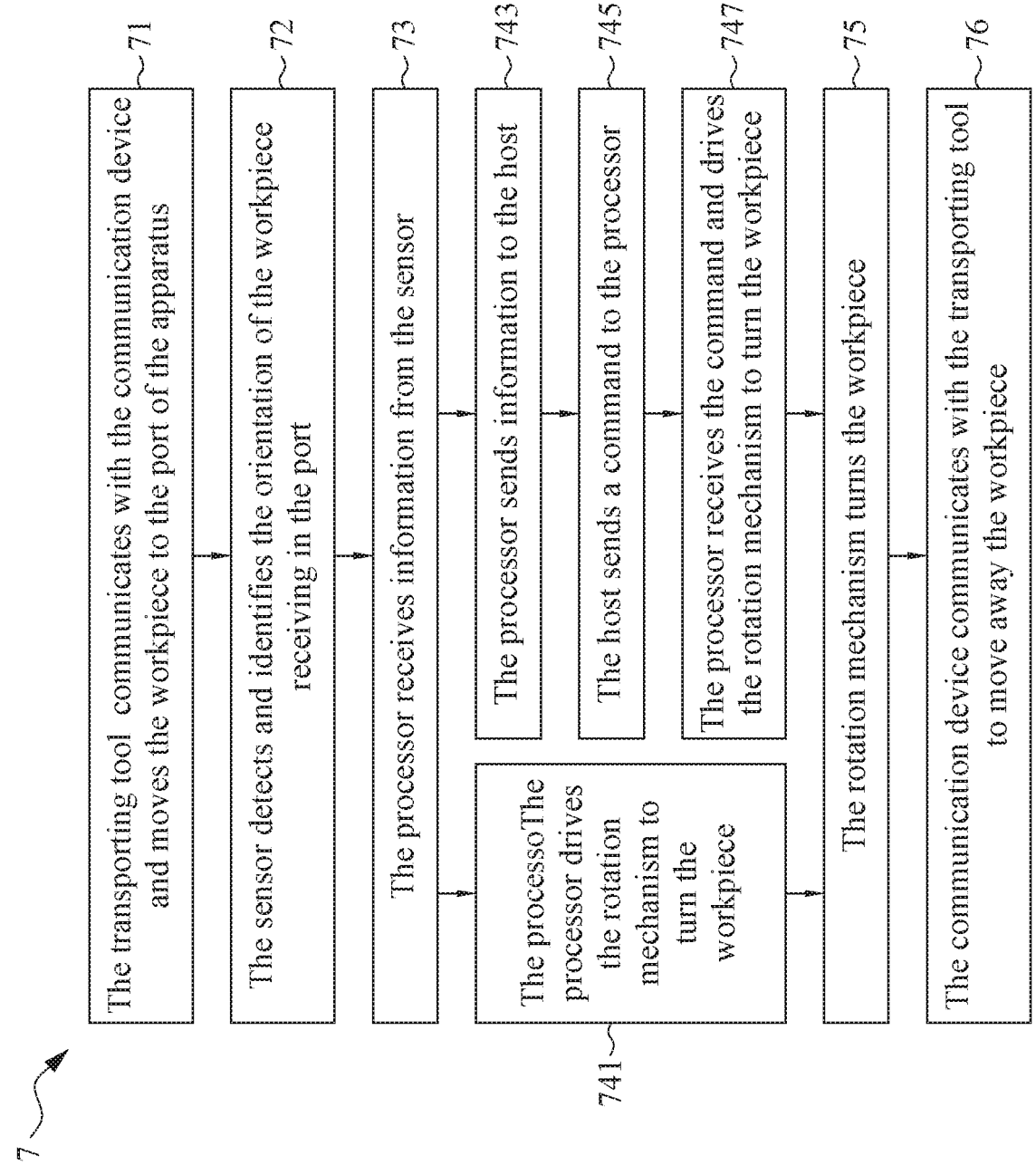
FIG. 4 is a flow chart representing exemplary operations of the method for operating the apparatus for transporting the workpiece, in accordance with some embodiments of the present disclosure.

Referring to FIG. 4 and with additional reference to FIG. 1A, FIG. 1B and FIG. 2, an exemplary method 7 illustrates one possible flow through the apparatus 3 of FIG. 2.

In Operation 71, the carrier 5 is moved from the load port 101 of the first manufacturing tool 10 to the port 31 of the apparatus 3 by the transporting tool 4. Meanwhile, the transporting tool 4 sends information to and communicates with the communication device 33 of the apparatus 3 such that the carrier 5 could be safely moved to the port 31 of the apparatus 3. For example, the transporting tool 4 may send information to the communication device 33 of the apparatus 3 when the OHT vehicle 41 moves the carrier 5 to the apparatus 3. After receiving such information, the communication device 33 of the apparatus 3 instructs and guides the OHT vehicle 41 to lower and release the carrier 5 in the port 31 of the apparatus 3.

In Operation 72, the sensor 32 of the apparatus 3 will detect the carrier 5 and identify the orientation of the carrier 5 after the carrier 5 is received in the port 31 of the apparatus 3. As shown in FIG. 1A and FIG. 1B, the carrier 5 has a tag 513 at its front side 51. When the carrier 5 is received in the port 31 of the apparatus 3, the sensor 32 of the apparatus 3, such as tag readers, RFID readers or CCD cameras, detects the tag 513 of the carrier 5 and thus identifies the orientation of the carrier 5.

In Operation 73, the sensor 32 sends the orientation information of the carrier 5 to the processor 37. After receiving such information, the processor 37 can identify where the front side 51 of the carrier 5 is and determine whether the carrier 5 should be turned.

In Operation 741, the processor 37 is configured to automatically drive the rotation mechanism 35 to rotate the carrier 5 after identifying the orientation of the carrier 5. For example, the processor 37 can be set to drive the rotation mechanism 35 to turn the carrier 5 180 degrees when the sensor 32 detects that the carrier 5 faces in a specific direction. Thus, once the processor 37 receives the information from the sensor 32 that the carrier 5 faces in the specific direction, the processor 37 automatically drives the rotation mechanism 35 until the carrier 5 is turned 180 degrees.

In Operations 743, 745 and 747, alternatively, the processor 37 drives the rotation mechanism 35 by a host command. In Operation 743, the processor 37 is configured to send the orientation information of the carrier 5 to the host 2. As shown in FIG. 2, the processor 37 connects to the host 2. After the processor 32 receives the orientation information of the carrier 5 from the sensor 32, the processor 32 can transfer such information to the host 2.

In Operation 745, the host 2 can determine whether the rotation mechanism 35 should turn the carrier 5 after receiving the information from the processor 37. If the host 2 identifies the orientation of the carrier 5 and determines that the carrier 5 needs to be turned, the host 2 will command the processor 37 to drive the rotation mechanism 35 to turn the carrier 5.

In Operation 747, the processor 37 drives the rotation mechanism 35 to rotate the carrier 5 after receiving a command from the host 2. As previously stated, the host 2 is configured to determine whether the carrier 5 received in the port 31 of the apparatus 3 needs to be turned. Once the host 2 determines that the carrier 5 received in the port 31 of the apparatus needs to be turned, the host 2 can send a command to the processor 37. The processor 37 drives the rotation mechanism 35 to rotate the carrier 5 after receiving the command.

Thus, in Operation 741, the processor 37 can (be set to) automatically drive the rotation mechanism 35. In Operations 743, 745 and 747, the processor follows the host command to drive the rotation mechanism 35. In some embodiments of the present disclosure, Operations 743, 745 and 747 are operated by the user. The user can monitor the orientation of the carrier 5 received in the port 31 of the apparatus 3 and send the command to the processor 37 of the apparatus 3 by the host 2.

In Operation 75, the rotation mechanism 35 is derived to rotate the carrier 5, in some embodiments of the present disclosure, the rotation mechanism 35 includes a robotic arm 353. The robotic arm can grasp the carrier 5 and rotate the carrier 5. Moreover, in some embodiments of the present disclosure, the rotation mechanism 35 includes a turntable 351 integrated in the port 31. The carrier 5 is located on the turntable 351 when the carrier is received in the port 31. When the turntable 351 is rotated, the carrier 5 received in the port 31 is rotated accordingly.

In Operation 76, after the carrier 5 is rotated by the rotation mechanism 35, the communication device 33 sends information to and communicates with the transporting tool 4. Then, the OHT vehicle 41 picks up the carrier 5 and moves the carrier 5 from the port 31 of the apparatus 3 to the load port 201 of the second manufacturing tool 2.

Figure 5:
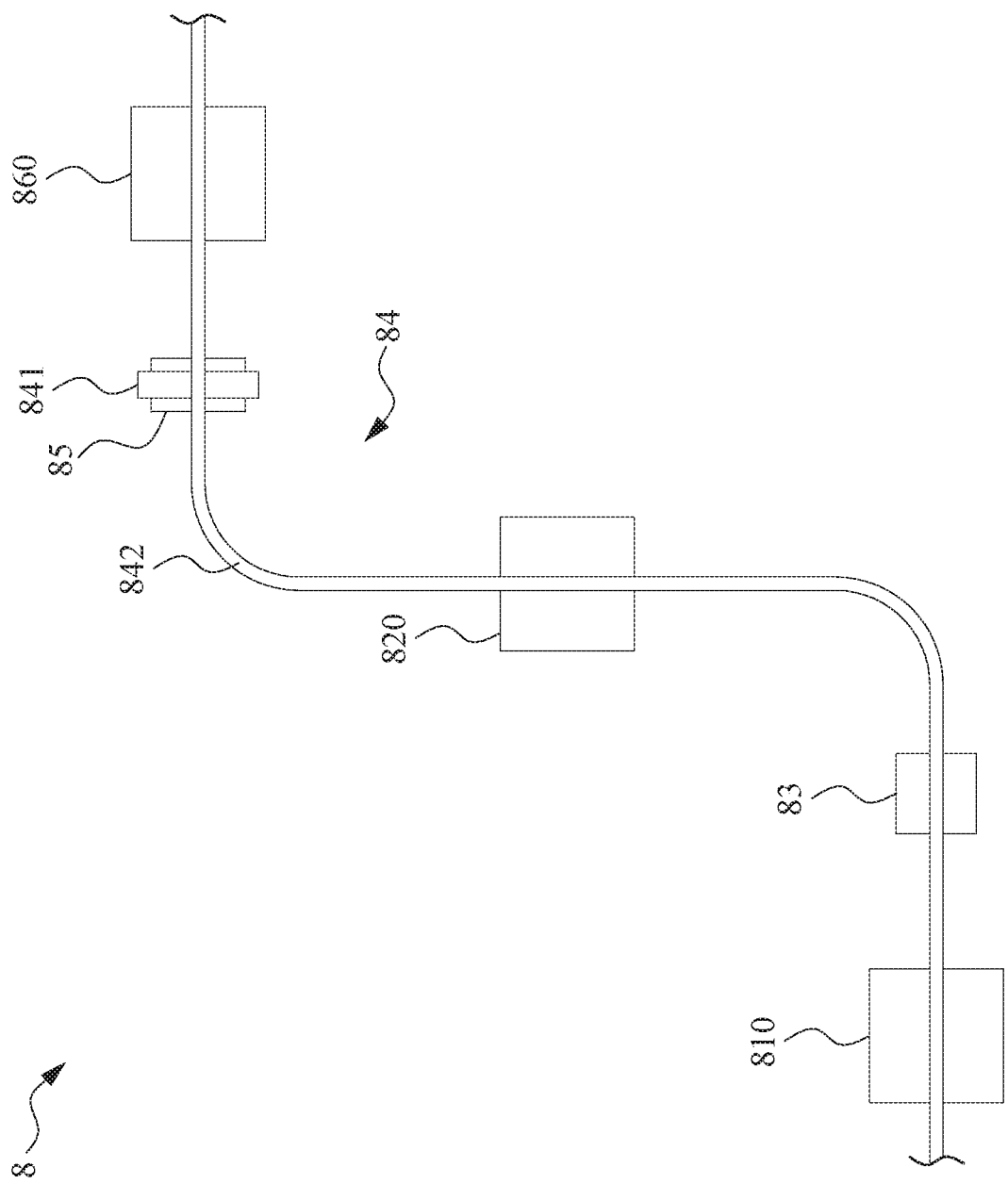
FIG. 5 is a top view of the system for the semiconductor fabrication facility, in accordance with some embodiments of the present disclosure.

FIG. 5 is a top view of the system 8 for the semiconductor fabrication facility, in accordance with some embodiments of the present disclosure. As shown in FIG. 5, the system 8 includes a transporting tool 84 configured to move the carrier 85. The transporting tool 84 includes the track 842 (including rails) and the OHT vehicle 841. As shown in FIG. 5, the OHT vehicle 841 is configured to complement and cooperate with the track 842 for rolling along the track 842 and transporting a carrier 85 from one location to another. The third manufacturing tool 810, the fourth manufacturing tool 820, the fifth manufacturing tool 860 and the orientation tool 83 are arranged along the track 842. In other words, they are arranged along the moving path of the carrier 85. When the carrier 85 is inserted into the third manufacturing tool 810, the front side of the carrier 85 faces east. When the carrier 85 is inserted into the fourth manufacturing tool 820, the front side of the carrier 85 faces north. Moreover, when the carrier 85 is inserted into the fifth manufacturing tool 860, the front side of the carrier 85 faces west. Thus, when the transporting tool 84 will move the carrier 85 from the third manufacturing tool 810 to the fifth manufacturing tool 860, the OHT vehicle 841 picks up the carrier 85 from the third manufacturing tool 810 and move the carrier 85 to the orientation tool 83. Then the orientation tool 83 rotates the carrier 85 such that the front side of the carrier 85 faces west. After the orientation tool 83 rotates the carrier 85, the OHT vehicle 841 picks up the carrier 85 from the orientation tool 83 and move the carrier 85 to the fifth manufacturing tool 860. Moreover, when the transporting tool 84 will move the carrier 85 from the fifth manufacturing tool 860 to the fourth manufacturing tool 820, the OHT vehicle 841 picks up the carrier 85 from the fifth manufacturing tool 860 and move the carrier 85 to the orientation tool 83. Then the orientation tool 83 rotates the carrier 85 such that the front side of the carrier 85 faces north. After the orientation tool rotates the carrier 85, the OHT vehicle 841 picks up the carrier 85 from the orientation tool 83 and move the carrier 85 to the fourth manufacturing tool 820.

It will be appreciated that in the forgoing method, the orientation of the workpiece (such as the carrier 5) in the system can be automatically corrected. When the system will move the workpiece from one tool to another tool but the orientations of the workpiece loaded in these two tools are different, the system can utilize the apparatus to turn the orientation of the workpiece such that the workpiece can be automatically moved from one tool to another tool by the system.

It will be further appreciated that the foregoing apparatus and system may be used in the automated material handling system (AMHS) for semiconductor fabrication facilities. Accordingly, the manufacturing tool is not limited to the EUV photolithography along, and the OHT vehicle is not limited to transport the reticle(s) along, either. The OHT vehicle may be appropriately configured to accommodate any type of customized by those skilled in the art without undue experimentation.

According to one embodiment of the present disclosure, an apparatus for orientating a workpiece includes a port configured to receive the workpiece, a sensor configured to detect an orientation of the workpiece received in the port, and a rotation mechanism configured to turn the workpiece received in the port.

According to another embodiment, a system for a semiconductor fabrication facility includes a first manufacturing tool configured to load a workpiece facing in a first direction, a second manufacturing tool configured to load the workpiece facing in a second direction, an orientation tool configured to adjust an orientation of the workpiece; and a transporting tool configured to move the workpiece. The first direction is different from the second direction. Further, the first manufacturing tool, the second manufacturing and the orientation tool are arranged along a moving path of the workpiece.

According to one embodiment of the present disclosure, a method for operating a system for a semiconductor fabrication facility includes: moving a workpiece to an apparatus by a transporting tool, detecting an orientation of the workpiece received in the apparatus by a sensor, turning the workpiece received in the apparatus by a rotation mechanism and moving the workpiece away from the apparatus of the apparatus by the transporting tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An orientation apparatus for orientating a carrier, comprising:
 a worktable configured to receive the carrier transported by a transporting tool; and
 an orientation mechanism configured to turn the carrier received in the worktable so as to change an orientation of the carrier;
 wherein the transporting tool has a track extending directly above a first manufacturing tool, a second manufacturing tool and the apparatus and configured to transport the carrier from the first manufacturing tool to the apparatus along the track and to transport the carrier from the apparatus to the second manufacturing tool along the track wherein the track of the transporting tool overlaps the first manufacturing tool, the second manufacturing tool and the apparatus from a top view perspective;

wherein the first manufacturing tool is configured to receive the carrier with its orientation in a first direction;

wherein the second manufacturing tool is configured to receive the carrier with its orientation in a second direction, the second direction being different from the first direction;

wherein the apparatus is free from being physically connected to an element above the apparatus, the first manufacturing tool and the second manufacturing tool;

wherein transporting tool transports the carrier from the first manufacturing tool to the worktable of the apparatus and then the orientation mechanism turns the carrier from its orientation in the first direction to its orientation in the second direction, and wherein the transporting tool transports the carrier from the worktable of the apparatus to the second manufacturing tool after the orientation mechanism turns the carrier from its orientation in the first direction to its orientation in the second direction.

2. The apparatus of claim 1, wherein the orientation mechanism includes a turntable.

3. The apparatus of claim 1, wherein the orientation mechanism is configured to rotate the carrier to be turned 180 degrees.

4. The apparatus of claim 1, wherein the orientation mechanism includes a robotic arm.

5. A system for a semiconductor fabrication facility, comprising:
   a first manufacturing tool configured to load a carrier facing in a first direction;
   a second manufacturing tool configured to load the carrier facing in a second direction, wherein the second direction is different from the first direction;
   an orientation tool configured to adjust an orientation of the carrier; and
   a transporting tool having a track, wherein the first manufacturing tool, the second manufacturing tool and the orientation tool are arranged underneath and along the track;
   wherein the track overlaps the first manufacturing tool, the second manufacturing tool and the orientation tool from a top view perspective;
   wherein the orientation tool is free from being physically connected to an element above the orientation tool, the first manufacturing tool and the second manufacturing tool;
   wherein the transporting tool is configured to move the carrier from the first manufacturing tool to the orientation tool along the track and to move the carrier from the orientation tool to the second manufacturing tool along the track;
   wherein the carrier faces in the first direction when the transporting tool move the carrier from the first manufacturing tool to the orientation tool along the track;
   wherein, after the orientation tool receives the carrier from the first manufacturing tool, the orientation tool turns the carrier such that the carrier faces in the second direction;
   wherein the carrier faces in the second direction when the transporting tool move the carrier from the orientation tool to the second manufacturing tool along the track.

6. The system of claim 5, wherein the transporting tool includes an overhead hoist transports (OHT) moving along the track and configured to move the carrier from the first manufacturing tool to the orientation tool and to move the carrier from the orientation tool to the second manufacturing tool.

7. The system of claim 5, wherein the track is configured to provide a single transporting path, wherein the carrier is moved between the first manufacturing tool, the second manufacturing tool and the orientation tool on the single transporting path, and wherein no other transporting path connects the single transporting path.

8. The system of claim 7, wherein the single transporting path starts from the first manufacturing tool and passes through the orientation tool and ends at the second manufacturing tool.

9. The system of claim 7, wherein the single transporting path starts from the first manufacturing tool and passes through the second manufacturing tool and ends at the orientation tool.

10. The system of claim 5, wherein the orientation tool is located between the first manufacturing tool and the second manufacturing tool.

11. The system of claim 5, wherein the orientation tool further comprises a rotation mechanism to turn the carrier.

12. The system of claim 11, wherein the rotation mechanism incudes a turntable.

13. The system of claim 11, wherein the rotation mechanism includes a robotic arm.

14. A method for changing an orientation of a carrier in a semiconductor fabrication facility, comprising:
   moving the carrier from a first manufacturing tool to an orientation apparatus by a transporting tool and along a track of the transporting tool, wherein the first manufacturing tool is configured to load the carrier facing in a first direction, and the carrier faces in the first direction during the moving process from the first manufacturing tool to the orientation apparatus;
   turning the carrier received in the orientation apparatus by an orientation mechanism such that the carrier is turned from it facing in the first direction to it facing in a second direction, wherein the first direction is different from the second direction; and
   moving the carrier away from the orientation apparatus to a second manufacturing tool by the transporting tool and along the track of the transporting tool, wherein the second manufacturing tool is configured to load the carrier facing in the second direction, and the carrier faces in the second direction during the moving process from the orientation apparatus to the second manufacturing tool;
   wherein the first manufacturing tool, the orientation tool and the second manufacturing tool are directly underneath the track of the transporting tool, and wherein the transporting tool includes an overhead hoist transport (OHT) connected to the track and configured to move the carrier along the track, and wherein the overhead hoist transports picks up the carrier from the first manufacturing tool, the orientation tool and the second manufacturing tool as long as it directly descends from the track;
   wherein the orientation apparatus is free from being physically connected to an element above the orientation apparatus, the first manufacturing tool and the second manufacturing tool and wherein the track of the transporting tool overlaps the first manufacturing tool, the second manufacturing tool and the orientation apparatus from a top view perspective.

15. The method of claim 14, wherein a section of the track which is used for the overhead hoist transports to move the carrier between the first manufacturing tool, the second manufacturing tool and the orientation tool is free from being connected to another track.

16. The method of claim 15, wherein the section of the track starts from the first manufacturing tool and passes through the orientation tool and ends at the second manufacturing tool.

17. The method of claim 15, wherein the section of the track starts from the first manufacturing tool and passes through the second manufacturing tool and ends at the orientation tool.

18. The method of claim 14, wherein the orientation mechanism includes a turntable configured to turn the carrier.

19. The method of claim 14, further comprising: sending a command, by a host, to drive the orientation mechanism to turn the carrier.

20. The method of claim 14, wherein the orientation mechanism includes a robotic arm configured to grasp and turn the carrier.

* * * * *